(12) United States Patent
Gallo et al.

(10) Patent No.: US 7,324,381 B2
(45) Date of Patent: Jan. 29, 2008

(54) LOW POWER MULTIPLE BIT SENSE AMPLIFIER

(75) Inventors: Girolamo Gallo, Padua (IT); Giulio G. Marotta, Rieti (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/416,672

(22) Filed: May 3, 2006

(65) Prior Publication Data

US 2007/0002630 A1 Jan. 4, 2007

(30) Foreign Application Priority Data

Jul. 4, 2005 (IT) .......................... RM2005A0353

(51) Int. Cl.
*G11C 16/06* (2006.01)
*G11C 16/04* (2006.01)
*G11C 7/10* (2006.01)
*G11C 7/00* (2006.01)

(52) U.S. Cl. .......................... 365/185.21; 365/185.17; 365/185.19; 365/185.2; 365/189.05; 365/191

(58) Field of Classification Search ........... 365/185.19, 365/185.2, 185.17, 189.05, 191
See application file for complete search history.

(56) References Cited

U.S. PATENT DOCUMENTS

| | | | |
|---|---|---|---|
| 5,805,498 A | 9/1998 | Lee et al. | |
| 5,881,000 A * | 3/1999 | Maeda | 365/189.09 |
| 5,889,716 A | 3/1999 | Hashimoto | |
| 5,936,906 A | 8/1999 | Tsen | |
| 6,009,040 A | 12/1999 | Choi et al. | |
| 6,097,635 A | 8/2000 | Chang | |
| 6,191,977 B1 | 2/2001 | Lee | |
| 6,307,783 B1 * | 10/2001 | Parker | 365/185.21 |
| 6,404,679 B1 | 6/2002 | Guedj | |
| 6,822,906 B2 | 11/2004 | Confalonieri | |
| 6,836,431 B2 | 12/2004 | Chang | |
| 6,885,600 B2 | 4/2005 | Tran et al. | |
| 6,956,779 B2 | 10/2005 | Tran | |
| 6,961,266 B2 | 11/2005 | Chang | |
| 2002/0180500 A1 * | 12/2002 | Okuda et al. | 327/158 |

FOREIGN PATENT DOCUMENTS

| | | |
|---|---|---|
| EP | 1 467 377 A1 | 10/2004 |
| EP | 1 699 054 A1 | 9/2006 |
| WO | WO 96/10256 A1 | 4/1996 |

* cited by examiner

*Primary Examiner*—Ly Duy Pham
(74) *Attorney, Agent, or Firm*—Leffert Jay & Polglaze, P.A.

(57) ABSTRACT

A sense amplifier for multiple level flash memory cells is comprised of a voltage ramp generator that generates a ramp voltage signal. Reference sense amplifiers compare an input reference current to a ramp current generated from the ramp voltage signal. When the ramp voltage signal is greater than the reference current, an output latch signal is toggled. A sense amplifier compares an input bit line current to a threshold and outputs a logical low when the bit line current goes over the threshold. The sense amplifier output is latched into one of three digital latches at a time determined by the latch signals. An encoder encodes the data from the three digital latches into two bits of output data.

18 Claims, 6 Drawing Sheets

US 7,324,381 B2

LOW POWER MULTIPLE BIT SENSE AMPLIFIER

RELATED APPLICATION

This application claims priority to Italian Patent Application Ser. No. RM2005A000353, filed Jul. 4, 2005, entitled "LOW POWER MULTIPLE BIT SENSE AMPLIFIER," which is commonly assigned.

TECHNICAL FIELD OF THE INVENTION

The present invention relates generally to memory devices and in particular the present invention relates to sense amplifiers in flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

Flash memory devices use a variety of sense amplifiers to read or verify the state of memory cells in a memory array. Verification of a non-volatile memory cell is accomplished by applying a potential to the control gate of the cell to be verified and then using a sense amplifier to compare a current generated by the cell with a known current from a reference cell. The reference cell is a non-volatile memory cell or bit that has a predefined charge that is set or trimmed by the manufacturer of the memory to produce a specific reference current in response to a known gate voltage. The sense amplifier determines whether the memory cell to be verified draws more or less current than the reference current. The sense amplifier thus determines if the memory cell is in a programmed state or an erased state.

Sense amplifiers can experience various problems. For example, in order to make flash memory devices more compatible with battery-operated devices, manufacturers of memory devices are reducing the supply voltage of flash memory devices. This can cause problems with the sense amplifier circuitry since the analog circuitry may not operate properly at lower supply voltages. Sense amplifiers also typically require a DC bias current of 20 to 50 µA. This can result in significant overall power consumption during read and verify operations, especially if a large number of sense amplifiers (typically 64 or 128) are simultaneously enabled. This would be the case in memory devices that support page and/or burst read access.

Additionally, in multi-level cell (MLC) memories, each sense amplifier requires a set of three or more reference cells with related circuitry. This increases the overall system power consumption as well as the silicon area of the die that is required for the circuitry. The larger quantity of reference cells also requires additional time for programming at the manufacturing site, resulting in longer test times and adding to the fabrication costs.

Another problem occurs with the latest introduction of multi-level cells. Each cell is capable of storing multiple bits of information. Each read operation of the N-bits stored in each memory cell requires N subsequent memory accesses. Therefore, the memory access time increases proportionally to the number of bits per cell.

For the reasons stated above, and for other reasons stated below which will become apparent to those skilled in the art upon reading and understanding the present specification, there is a need in the art for an improved sense amplifier circuit for use in higher performance memory devices.

SUMMARY

The above-mentioned problems with erasing a non-volatile memory device and other problems are addressed by the present invention and will be understood by reading and studying the following specification.

The present invention encompasses a sense amplifier circuit that senses a programmed state of an array of memory cells that are each capable of storing multiple bits. The sense amplifier is comprised of a voltage ramp generator that generates a ramp voltage signal. Reference sense amplifiers compare an input reference current to a ramp current generated from the ramp voltage signal. When the ramp voltage signal is greater than the reference current, an output latch signal is toggled. A sense amplifier compares an input bit line current to a threshold and outputs a logical low when the bit line current goes over the threshold. The sense amplifier output is latched into one of three digital latches at a time determined by the latch signals. An encoder encodes the data from the three digital latches into two bits of output data.

Further embodiments of the invention include methods and apparatus of varying scope.

DETAILED DESCRIPTION

Figure 1:
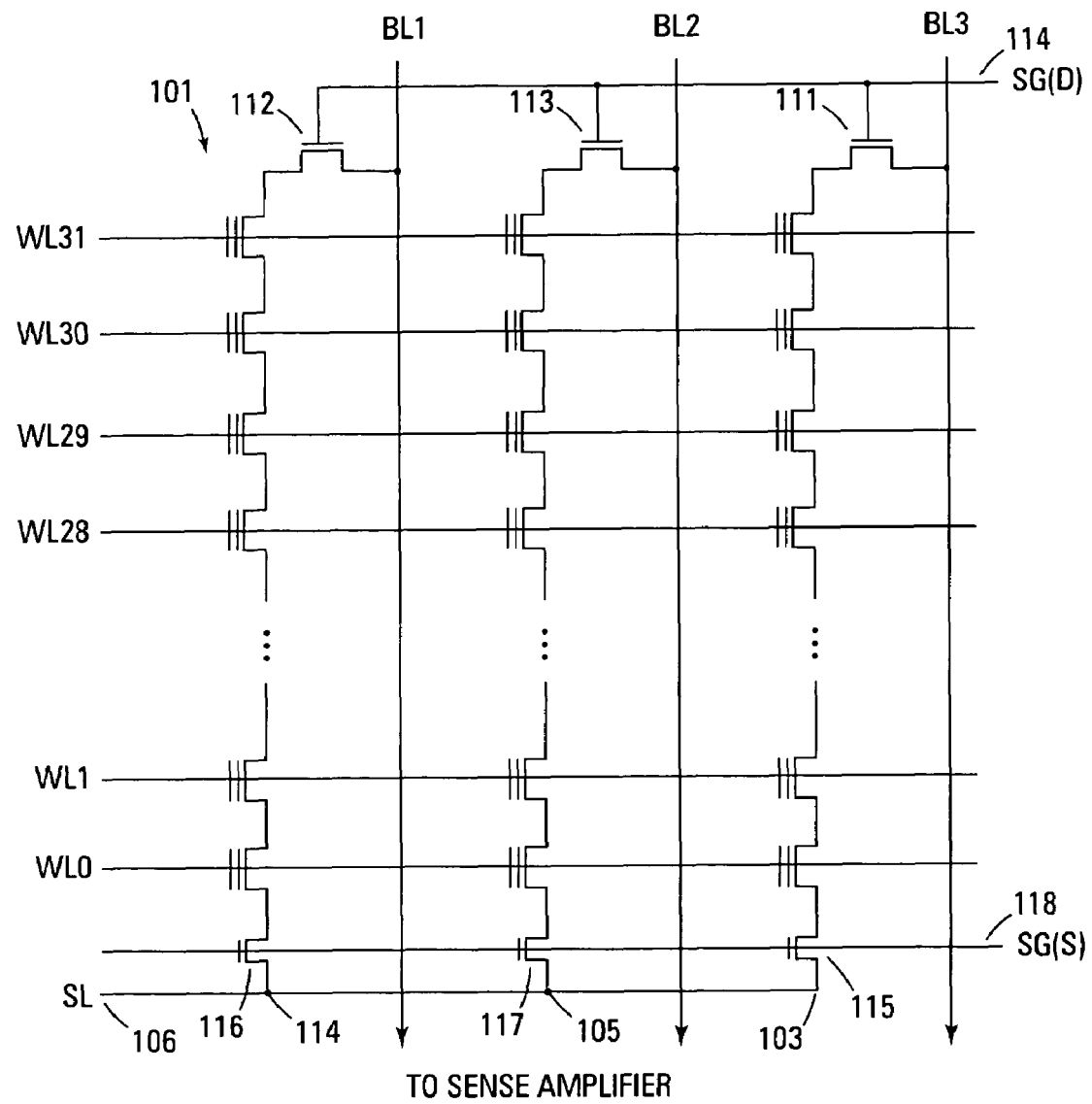
FIG. 1 shows a simplified schematic diagram of one embodiment of a NAND flash memory array of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified schematic diagram of one embodiment for a NAND flash memory array of the present invention. This figure is for purposes of illustration only as the present invention is not limited to any one array architecture. For example, other possible array architectures that can use the embodiments of the sense amplifier of the present invention include NOR and AND architectures.

The memory array of FIG. 1, for purposes of clarity, does not show all of the elements typically required in a memory array. For example, only three bit lines are shown (BL1, BL2, and BL3) when the number of bit lines required actually depends upon the memory density. Each memory block can have thousands of bit lines.

The array is comprised of an array of floating gate cells 101 arranged in series columns 103, 104, 105. Each of the floating gate cells 101 are coupled drain to source in each series chain 103, 104, 105. A word line (WL0-WL31) that spans across multiple series strings 103, 104, 105 is coupled to the control gates of every floating gate cell in a row in order to control their operation. The bit lines (BL1-BL3) are eventually coupled to sense amplifiers (not shown) that detect the state of each cell.

In operation, the word lines (WL0-WL31) select the individual floating gate memory cells in the series chain 103, 104, 105 to be written to or read from and operate the remaining floating gate memory cells in each series string 103, 104, 105 in a pass through mode. Each series string 103, 104, 105 of floating gate memory cells is coupled to a source line 106 by a source select gate 115, 116, 117 and to an individual bit line (BL1-BL3) by a drain select gate 111, 112, 113. The source select gates 115, 116, 117 are controlled by a source select gate control line SG(S) 418 coupled to their control gates. The drain select gates 111, 112, 113 are controlled by a drain select gate control line SG(D) 114.

Each cell can be programmed as a single bit per cell (i.e., single level cell—SLC) or multiple bits per cell (i.e., multi-level cell—MLC). Each cell's threshold voltage ($V_t$) determines the data that is stored in the cell. For example, in a single bit per cell, a $V_t$ of 0.5V might indicate a programmed cell while a $V_t$ of –0.5V might indicate an erased cell. The multi-level cell may have multiple $V_t$ windows that each indicates a different state. Multi-level cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected word line for the flash memory cell to be programmed is biased with a series of programming pulses starting at a predetermined voltage (e.g., approximately 16V) and incrementing until the cell is programmed or a maximum program voltage is reached.

Figure 2:
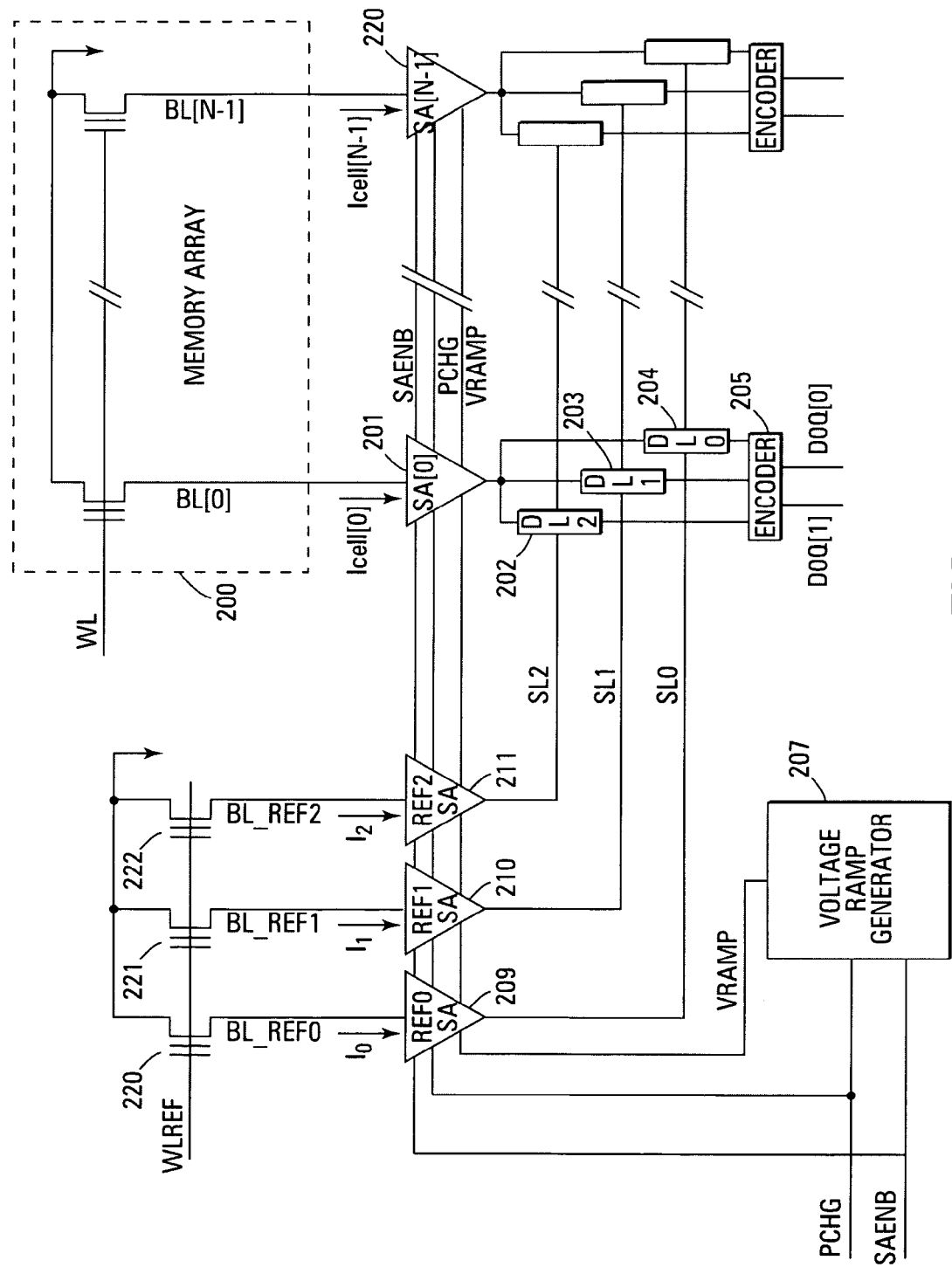
FIG. 2 shows a schematic diagram of one embodiment for sense amplifier circuitry of the present invention.

FIG. 2 illustrates one embodiment for sense amplifier circuitry of the present invention. The circuitry uses a voltage ramp generator 207 to generate a time-varying voltage to the sense amplifiers.

The sense amplifier circuitry is comprised of N sense amplifiers SA[0]-SA[N–1] 201, 220. The sense amplifiers 201, 220 each have an input coupled to a bit line BL[0]-BL[N–1] of the memory array 200. The quantity of sense amplifiers required depends on the memory array density since each bit line of the array is coupled to a sense amplifier. Hence, N bit lines requires N sense amplifiers. The sense amplifiers are described subsequently in greater detail with reference to FIG. 3.

In one embodiment, the sense amplifier circuitry is comprised of three reference sense amplifiers 209-211. Alternate embodiments may use other quantities of reference amplifiers 209-211. A reference Floating Gate Avalanche Metal Oxide Semiconductor (FAMOS) cell 220-222 is coupled to each reference amplifier 209-211 through a bit line decoding structure BL_REF0 through BL_REF2. The reference cells 220-222 are coupled to a dedicated reference word line WLREF and row decoding circuitry that is substantially similar to that used in the memory array 200.

The voltage ramp generator circuit 207 is coupled to the reference sense amplifiers 209-211 and the sense amplifiers 201, 220. The voltage ramp generator 207 generates the time-varying voltage that is used by the reference sense amplifiers 209-211 to produces a reference current that varies over time. The time varying reference current is used to determine the current range to which the memory cell current belongs in order to determine the data values stored in each cell. A typical prior art sense amplifier uses only a constant current since the sense amplifier has just to discriminate whether the memory cell current is less than or greater than the reference current. The voltage ramp generator 207 is described subsequently in greater detail with reference to FIG. 6.

The output of each sense amplifier 201, 220 is coupled to multiple D-type latches DL0-DL2 202-204. The output signals SL0-SL2 from the reference sense amplifiers 209-211 are used to control the operation of DL0-DL3 202-204, respectively. The quantity of D latches is dependent on the quantity of reference sense amplifiers. The composition and operation of DL0-DL2 is discussed subsequently with reference to FIG. 3.

An encoder circuit 205 is coupled to the output of DL0-DL2 202-204. Each encoder 205 outputs data bits to the DQ outputs of the memory device. In this embodiment, DQ0[0] and its complement DQ0[1] are output. Note that DQ0[0] and DQ0[1] are not logical complements but are the sense amplifier digital outputs according to the table below. Other encoders that are coupled to sense amplifiers for other data bits output DQ1-DQN. The composition and operation of the encoder 205 is discussed subsequently with reference to FIG. 3.

In operation, the current $I_{cell[0]}$-$I_{cell[N-1]}$ from a selected bit line is input to its respective sense amplifier SA[0]-SA[N–1]. The reference sense amplifiers 209-211 compare the reference currents I0-I2 from the reference cells 220-222 with the ramped current from the ramp generator 207. As the ramped current becomes equal to or higher than the reference current, the corresponding reference amplifier output S1[i] toggles.

The digital latches 202-204 sample the sense amplifier 201 output value at the time instant determined by the reference sense amplifiers 209-211. The sampling time is determined by the toggling of the SL0-SL2 signals to the latches 202-204.

The outputs DL0-DL2 from the latches 202-204 are input to the encoder circuit 205. These values are then encoded, using the subsequently discussed table, into the digital output signals DQ[i].

Figure 3:
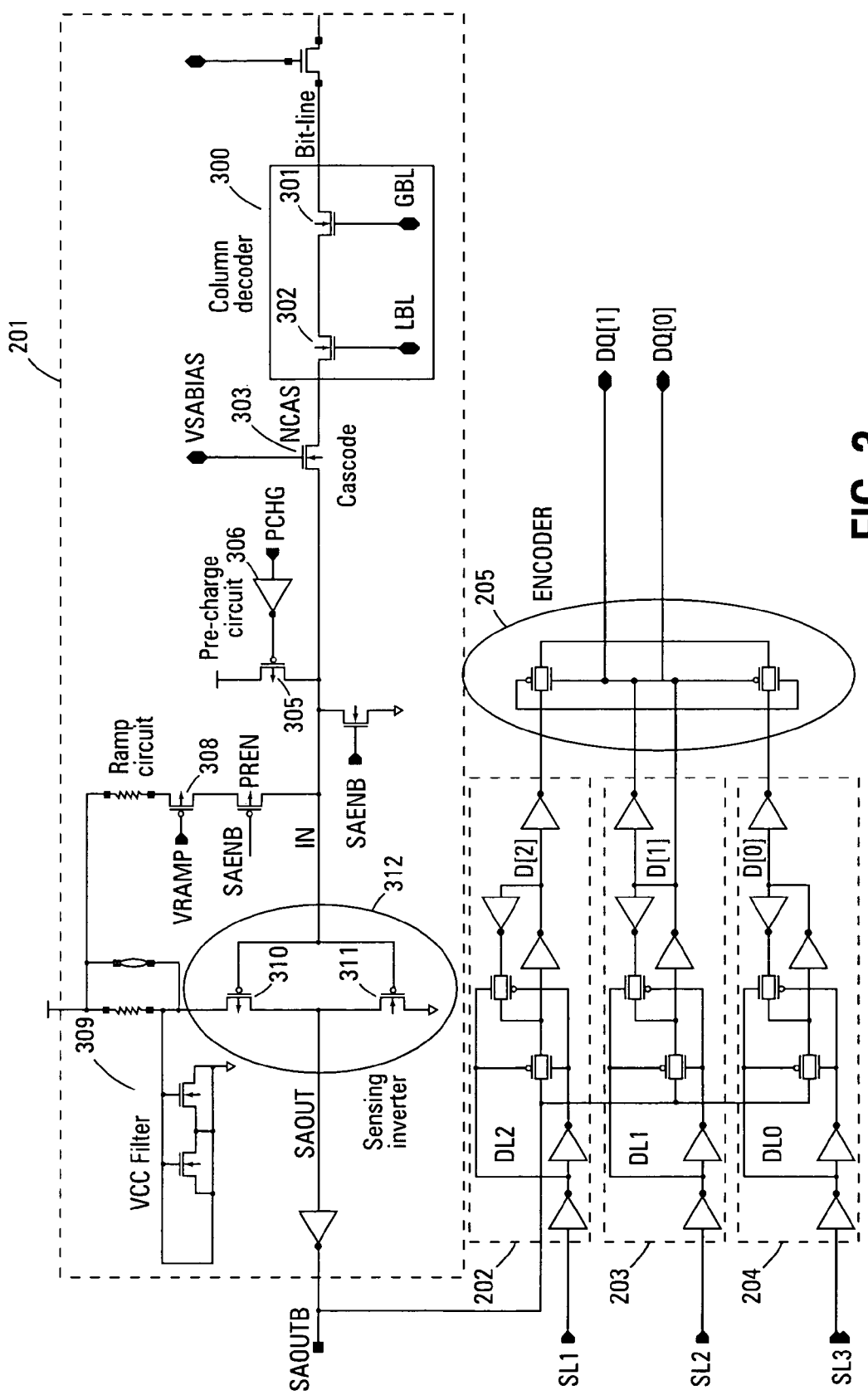
FIG. 3 shows a schematic diagram of one embodiment for sense amplifiers in accordance with the circuit of FIG. 2.

FIG. 3 illustrates a schematic diagram of one embodiment of the sense amplifier SA[0] 201, DL0-DL2 data latches 202-204, and the encoder 205 of FIG. 2. The remaining SA[1]-[N-1] sense amplifiers and peripheral circuitry are substantially similar to the circuitry illustrated in FIG. 3.

The sense amplifier 201 is comprised of a column decoder 300 that is enabled by column select signals GBL and LBL. The column select signals are coupled to the control gates of two n-channel transistors 301, 302. A logical high signal on both of these signals substantially simultaneously causes them to turn on, connecting the sense amplifier 201 to the drain of the selected FAMOS cell.

A cascode n-channel transistor 303 controls the maximum bit line voltage during the sensing operation. When the sense amplifier input node IN is precharged to $V_{CC}$, the cascode transistor 303 limits the bit line and, therefore, the cell drain voltage to $VBL_{sense}=V_{SABIAS}-Vgs_{NCAS}$ where $V_{SABIAS}$ is the gate bias and $Vgs_{NCAS}$ is the gate-to-source voltage of the transistor 303.

A sense amplifier enable signal SAENB is used to disable the sense amplifier during the stand-by mode when PCHG=GBL=LBL=0V. Both SAENB and the precharge enable signal PCHG are, in one embodiment, generated by a memory controller circuit on the memory device that is described later with reference to FIG. 6.

The sensing operation is performed in two phases: the pre-charge phase and the discharge phase. The pre-charge transistor 305 is activated by the PCHG signal. This signal is set to $V_{CC}$ during the pre-charge phase of a read cycle. The logic high during the pre-charge phase is inverted to a low by an inverter 306 that then turns on the transistor 305. During this phase, the sense amplifier input and the selected bit line are charged to $V_{CC}$ and $VBL_{sense}$, respectively.

Figure 5:
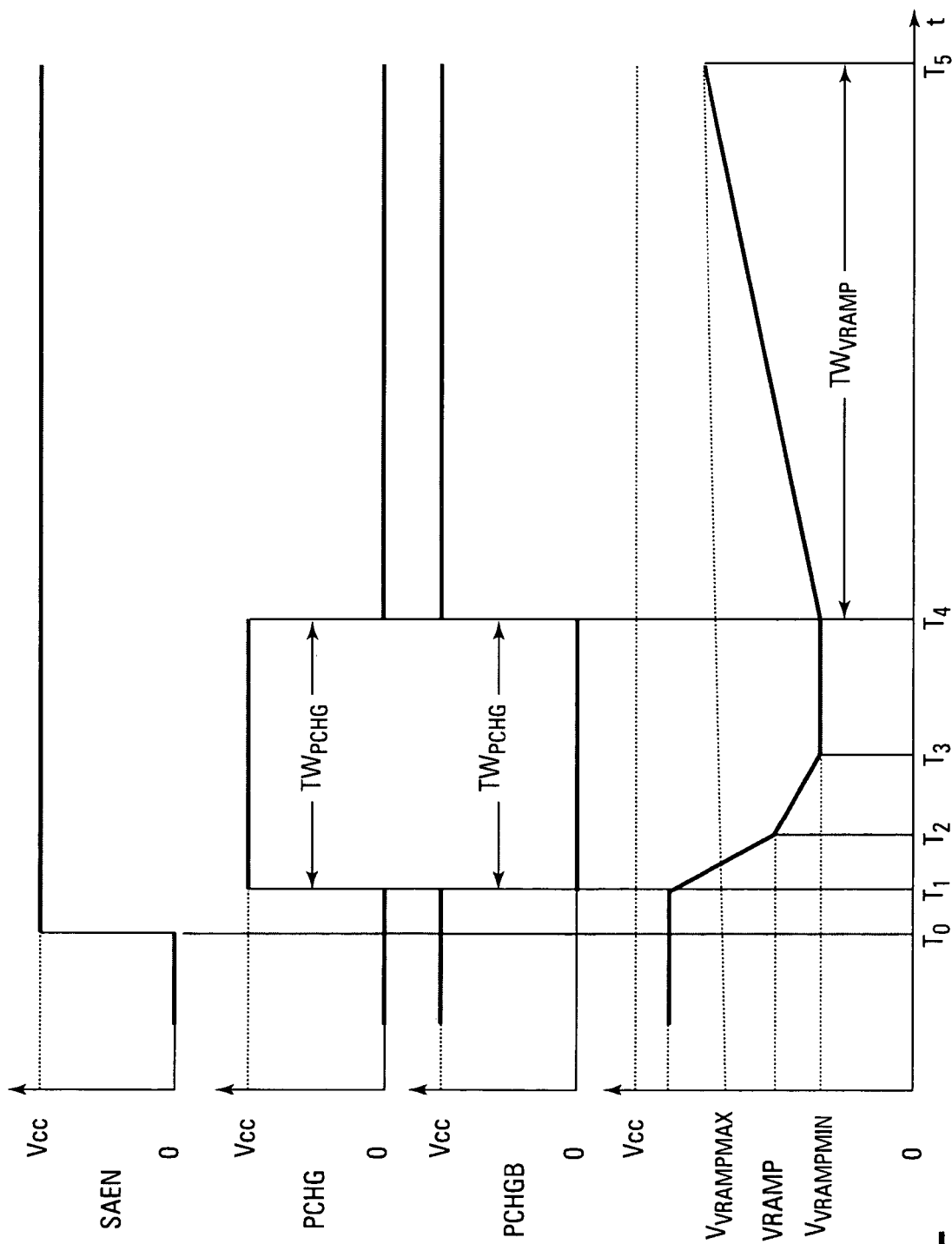
FIG. 5 shows a timing diagram of the voltage ramp generator circuit in accordance with FIG. 4.

A voltage ramp signal VRAMP, generated by the voltage ramp generator 207 of FIG. 2 and described subsequently in FIG. 5, is applied to the gate of a ramp circuit transistor 308 during the discharge phase. The RC circuit 309 connected to the source of the p-channel transistor 310 filters out power supply noise that could disturb the operation of the sense amplifier inverter 312. This inverter is comprised of the p-channel transistor 310 and an n-channel transistor 311.

Once the circuit is enabled (i.e., SAENB=0) and the addressed memory cell is selected (GBL=LBL=4.5V), the pre-charge signal PCHG is set to $V_{CC}$ to start the bit line pre-charge phase. As a result, the sense amplifier input IN and the bit line BL are pre-charged to $V_{CC}$ and $VBL_{sense}$, respectively as previously discussed. During the pre-charge phase, the gate of the ramp circuit transistor 308 is biased to a constant voltage $VRAMP_{min}$ so that the transistor 308 sources a constant current $I_{R0}$. This current is approximately 30% higher than the maximum level of FAMOS reference cell current $I_0$.

Once the BL capacitance is fully pre-charged to $VBL_{sense}$, the pre-charge signal PCHG is set to 0V while VRAMP starts to rise from its initial steady value $VRAMP_{min}$. This condition initiates the sensing phase in which the sense amplifier input node IN and the bit line BL are pulled up by ramp circuit transistor 308 current and, at substantially the same time, discharged by the FAMOS cell current.

At the beginning of the sensing phase, the pull-up current is higher than the cell current so that the sense amplifier input IN remains tied to $V_{CC}$. When the pull-up current becomes smaller than the cell current, the latter starts discharging the BL capacitance and, consequently, the sense amplifier input node. As soon as the sense amplifier input voltage becomes lower than the sense amplifier inverter 312 threshold, the sense amplifier output node SAOUTB toggles from $V_{CC}$ to ground.

If it is assumed, as a 0-order approximation, that the current $I_{ramp}$, sourced by the ramp circuit transistor 308, varies linearly with the time t with a slew rate SR then: $I_{ramp}=I_{rmax}-SR \cdot t$. It is then well known by those skilled in the art that the time, $\Delta T$, that it takes for the sense amplifier output node SAOUTB to switch from VCC to ground is given by:

$$\Delta T = \frac{I_{rmax} - I_{cell} + \sqrt{SR * C * (V_{CC} - V_{trip})}}{SR}$$

where $I_{cell}$ is the FAMOS cell current, C the capacitance of the input node IN and $V_{trip}$ is the switching threshold voltage of the sensing inverter 312. As a result, the sense amplifier operates as a current-to-time conversion circuit that translates the FAMOS cell current into a voltage pulse, with a time duration of $\Delta T$.

As one example of operation, assuming the three reference cells that are connected to their respective reference sense amplifiers have the following current levels: $I_0$=30 μA, $I_1$=20 μA, and $I_2$=10 μA and assuming that SR=1 μA/ns, $V_{CC}$=1.8V, $I_{max}$=40 μA, C=10 fF, and $V_{trip}$=0.8V then $\Delta T_0$=14 ns, $\Delta T_1$=24 ns, and $\Delta T_2$=34 ns. Therefore, the sensing circuit of the present invention provides equally spaced time pulses in response to equally spaced input currents.

The three reference sense amplifiers 220-222 of FIG. 2 generate three data latching signals SL0, SL1, and SL2. These signals control the three data latches DL0, DL1, and DL2 that are coupled to the output of each sense amplifier. The output of a regular sense amplifier is a voltage pulse $\Delta T_{cell}$. The duration of which depends on the cell current $I_{cell}$ according to the above equation for $\Delta T$. Therefore, at the end of the sensing operation, the data D[2,0], stored in the three latches DL2-DL0, is as shown in the following table:

|  |  | D[2] | D[1] | D[0] | DQ[1] | DQ[0] |
|---|---|---|---|---|---|---|
| $I_{cell} < I_{ref2}$ | $\Delta T > \Delta T_2$ | 0 | 0 | 0 | 0 | 0 |
| $I_{ref2} < I_{cell} < I_{ref1}$ | $\Delta T_1 < \Delta T < \Delta T_2$ | 1 | 0 | 0 | 0 | 1 |
| $I_{ref1} < I_{cell} < I_{ref0}$ | $\Delta T_0 < \Delta T < \Delta T_1$ | 1 | 1 | 0 | 1 | 0 |
| $I_{cell} > I_{ref0}$ | $\Delta T < \Delta T_0$ | 1 | 1 | 1 | 1 | 1 |

The three bits, D[2], D[1], and D[0], are then converted into the 2-bit output data DQ[1,0] by the encoder 205 of FIG. 2. Each physical memory cell of the present invention, therefore, can store two digital bits that represent four analog values.

Figure 4:
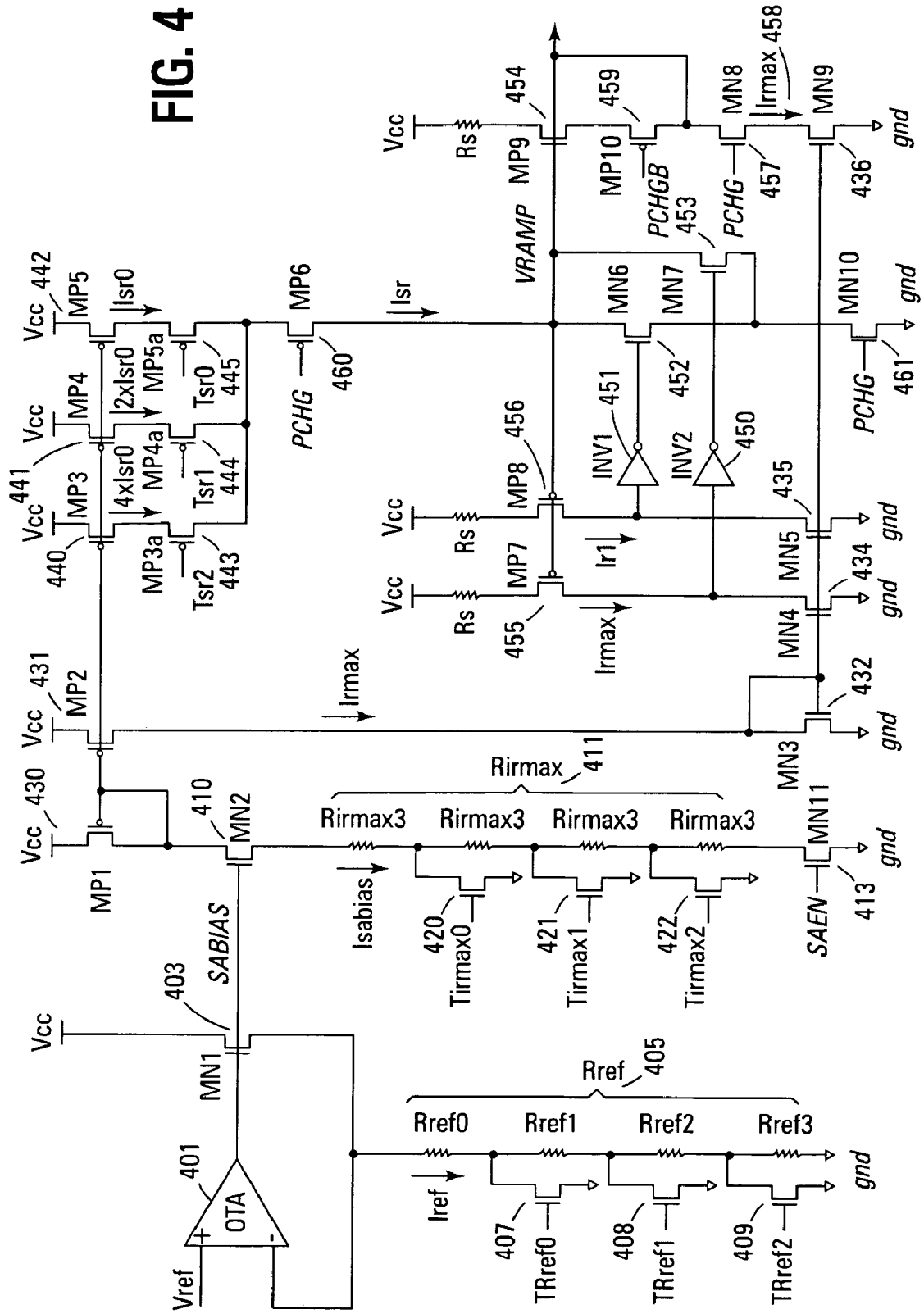
FIG. 4 shows a schematic diagram of one embodiment of the voltage ramp generator circuit in accordance with the circuit of FIG. 2.

FIG. 4 illustrates a schematic diagram of one embodiment for the voltage ramp generator 207 of FIG. 2. This circuit generates the VRAMP signal as discussed previously.

A power supply and temperature independent voltage $V_{ref}$ are fed into the non-inverting input of an operational transconductance amplifier (OTA) 401. The output of the OTA 401 drives the gate of an n-channel transistor 403 MN1. The source of MN1 is connected to the circuit ground through a resistor network $R_{ref}$ 405.

The $R_{ref}$ network 405 is adjustable through a set of digital signals $TR_{ref0}$, $TR_{ref1}$, and $TR_{ref2}$ that drive the gates of control transistors 407-409. The digital signals turn on their respective transistor 407-409 in order to adjust the current $I_{ref}$. Even thought three resistors and their control transistors are shown in the $R_{ref}$ network 405, the actual quantity of resistors and control transistors can be varied in alternate embodiments according to the desired trimability range and granularity. In one embodiment, the trimming digital signals $TR_{ref0}$, $TR_{ref1}$, $TR_{ref2}$ can be stored in dedicated on-chip non-volatile latches to be written to the circuit.

The OTA 401 forces the voltage of the source of transistor MN1 403 to be equal to $V_{ref}$. $I_{ref}$ is, therefore, given by $I_{ref}=V_{ref}/R_{ref}$. The voltage of node SABIAS is then $V_{SABIAS}=V_{ref}+V_{gsMN1}$ where $V_{gsMN1}$ is the gate-to-source voltage of transistor MN1 403 when its drain current is equal to $I_{ref}$. Circuit node SABIAS is connected to the gate of transistor MN2 410.

The source of transistor MN2 410 is connected to ground through resistor network $R_{imax}$ 411 and transistor MN11 413. Transistor MN11 413 is turned on when SAEN is asserted to a high level. $R_{imax}$ value is adjustable in a substantially similar method to $R_{ref}$ as described previously. Digital signals $T_{irmax0}$, $T_{irmax2}$, and $T_{irmax2}$ are input to gates of control transistors 420-422 in order to adjust current $I_{sabias}$. Even thought three resistors and their control transistors are shown in the $R_{imax}$ network 411, the actual quantity of resistors and control transistors can be varied in alternate embodiments according to the desired trimmability range and granularity. In one embodiment, the trimming digital signals $T_{irmax0}$, $T_{irmax1}$, $T_{irmax2}$ can be stored in dedicated on-chip non-volatile latches to be written to the circuit.

Transistor MN2 410 carries drain current $I_{sabias}$ that is given by $I_{sabias}=(V_{SABIAS}-V_{gsMN2})/R_{imax}$. By substituting for $V_{SABIAS}$ from above: $I_{sabias}=(V_{ref}+V_{gsMN1}-V_{gsMN2})/R_{imax}$. If transistor MN1 403 is fabricated with the same sizing and shape as transistor MN2 410 and if, by properly configuring $R_{ref}$'s and $R_{imax}$'s trimming signals, $I_{ref}$ is made equal to $I_{sabias}$, then $V_{gsMN1}=V_{gsMN2}$ and thus $I_{sabias}=V_{ref}/R_{imax}$. The same result could be obtained if the inverting input of the OTA were connected to the source of transistor MN2 410 with no need for network $R_{ref}$ 405 and transistor MN1 403. This circuit is used in order to meet the output data valid specification for a flash memory device.

Typically flash memory devices should have the output data valid within an access time less than 100 ns. When not accessed, the memory chip is in a stand-by mode that is characterized by a supply current consumption of less than 50 µA. For the sensing circuits to respond in such a short time, the voltage SABIAS has to be permanently present from chip power-up since the OTA 401 would not be ready within a memory access time. On the other hand, the OTA 401 power consumption has to be small not to impair the stand-by power specification. Therefore, by adding transistor MN1 403 and resistor network $R_{ref}$ 405, it is possible to keep the OTA 401 and $I_{ref}$ always on so as to ensure that SABIAS is already present when an access to the memory is requested. $R_{ref}$ can be made much larger than $R_{imax}$ to ensure stand-by power requirements. For the condition that $V_{gsMN1}=V_{gsMN2}$ needed for the equation above to hold true is satisfied when $R_{ref}=K\times R_{imax}$ provided that the width over length ratio of transistor MN2 410 is made K times larger than that of MN1 when transistor MN1 403 and transistor MN2 410 have the same channel current density. $R_{imax}$ can be thus made sufficiently small so as to ensure the desired quick response time when the memory access is initiated by the SAEN signal.

Referring again to FIG. 4, current $I_{sabias}$ is fed into the current mirror formed by transistors MP1 430 and MP2 431. The drain current of transistor MP2 431, $I_{rmax}$, is fed into the current mirror circuit comprised of transistor MN3 432, transistor MN4 434, transistor MN5 435, and transistor MN9 436. The drain current of transistor MN4 434 is substantially equal to $I_{rmax}$. The drain current Ir1 of transistor MN5 is made substantially equal to a fraction of $I_{rmax}$ by properly choosing the width over length (W/L) ratios of transistors MN5 435 and MN3 432. In one embodiment, $I_{r1}/I_{rmax}=\frac{2}{3}$ is one example for the timing requirements of state of the art NOR-type memory devices at deep sub-micron technology nodes. The drain current of transistor MN9 436 is made substantially equal to $I_{rmax}$ itself.

The gate of transistor MP1 430 is also connected to the gates of transistors MP3 440, MP4 441, and MP5 442 in order to generate a set of binary weighted currents Isr0, 2·Isr0, and 4·Isr0. These currents are combined according to a three bit digital word Tsri (I=2, 1, 0) applied to the gates of transistors MP3a 443, MP4a 444, and MP5a 445 respectively. This determines the current $I_{sr}$ that, as seen later, determines the voltage ramp slew rate SR where $$I_{sr} = \sum_{i=0}^{2} \overline{T_{sri}} \cdot 2^i \cdot I_{sr0} I_{sr}.$$

The quantity of trimming bits $T_{sri}$ can be changed depending on the desired adjustability range and granularity.

The timing of the voltage ramp generator circuit of FIG. 4 is illustrated in FIG. 5. At time T0, the enabling signal SAEN is asserted high. After a short delay, at time T1, the pre-charge phase is initiated by the assertion of signal PCHG. At time T1, the voltage of node VRAMP is at a value close to that of VCC. At T1, the drain currents of transistors MP7 455 and MP8 456 of FIG. 4 are substantially close to 0, transistors MN8 457 and MP10 459 are on since PCHG is logically high and PCHGB is logically low. Transistor MN9 458 starts to discharge the capacitance $C_{vramp}$ of node VRAMP. Since drain currents of transistors MP7 455 and MP8 456 are close to 0, the inputs of inverters INV1 451 and INV2 450 are pulled to ground (logic 0) by transistors MN5 435 and MN4 434 respectively. Therefore, transistors MN6 452 and MN7 453 turn on and their drain currents contribute to quickly discharge $C_{vramp}$ toward ground. This is needed since $I_{rmax}$ alone would not be sufficient for the VRAMP node voltage to reach the desired $V_{VRAMPMIN}$ value within the PCHG pulse duration $TW_{PCHG}$ (e.g., tens of nanoseconds) as desired. As the VRAMP voltage drops, the drain currents of transistors MP7 455 and MP8 456 gradually increase. As, at time T2, these currents reach a value $I_{r1}<I_{rmax}$, the INV1 451 input goes high and MN6 452 turns off and the discharge speed of $C_{vramp}$ decreases. This is useful for preventing VRAMP voltage from under-shooting below the $V_{VRAMPMIN}$ value. The VRAMP voltage continues to decrease at a lower speed until the drain currents of transistors MP7 455 and MP8 456 become substantially equal to $I_{rmax}$. At this time (e.g., time T3 in FIG. 5), inverter INV2 450 input goes high, transistor MN7 453 turns off and the VRAMP voltage stays at the $V_{RAMPMIN}$ value given by: $V_{VRAMPMIN}=V_{CC}-I_{rmax}\cdot RS-V_{gsMP9}$ where $V_{gsMP9}$ designates the source to gate voltage of transistor MP9 454.

The VRAMP voltage remains at $V_{RAMPMIN}$ until the PCHG signal is de-asserted at time T4 in FIG. 5. At time T4, since PCHG is low and PCHGB is high, transistors MP10 459 and MN8 457 turn off and transistor MP6 460 turns on. This allows current $I_{sr}$, illustrated in the equation above, to begin recharging up the VRAMP node capacitance. The VRAMP voltage increases linearly with time until it reaches the $V_{RAMPMAX}$ value given by $V_{RAMPMAX}=V_{CC}-V_{gsMp9}$. Note that while VRAMP voltage increases and, consequently, drain currents of transistors MP7 455 and MP8 456 decrease, transistor MN10 461 is forced off by the PCHG de-assertion, thus preventing drain currents from transistors MN6 452 and MN7 453 from altering the VRAMP slew rate (SR). SR is therefore dependent on $I_{sr}$ and $C_{VRAMP}$ only. The following equation applies to the voltage ramp between times T4 and T5 of FIG. 5: $C_{VRAMP}=I_{sr}\cdot\Delta T/\Delta V$. The voltage ramp slew rate is therefore given by: $SR=\Delta V/\Delta T=I_{sr}/C_{VRAMP}$.

The $V_{RAMP}$ signal, when applied to the gate of the current generators, each formed by the series resistor identical to $R_s$ and a transistor identical to MP9, forces them to source currents varying linearly from $I_{rmax}$ to zero. The source currents are used in the sense amplifier bank to read information from the memory cell array as described previously.

Figure 6:
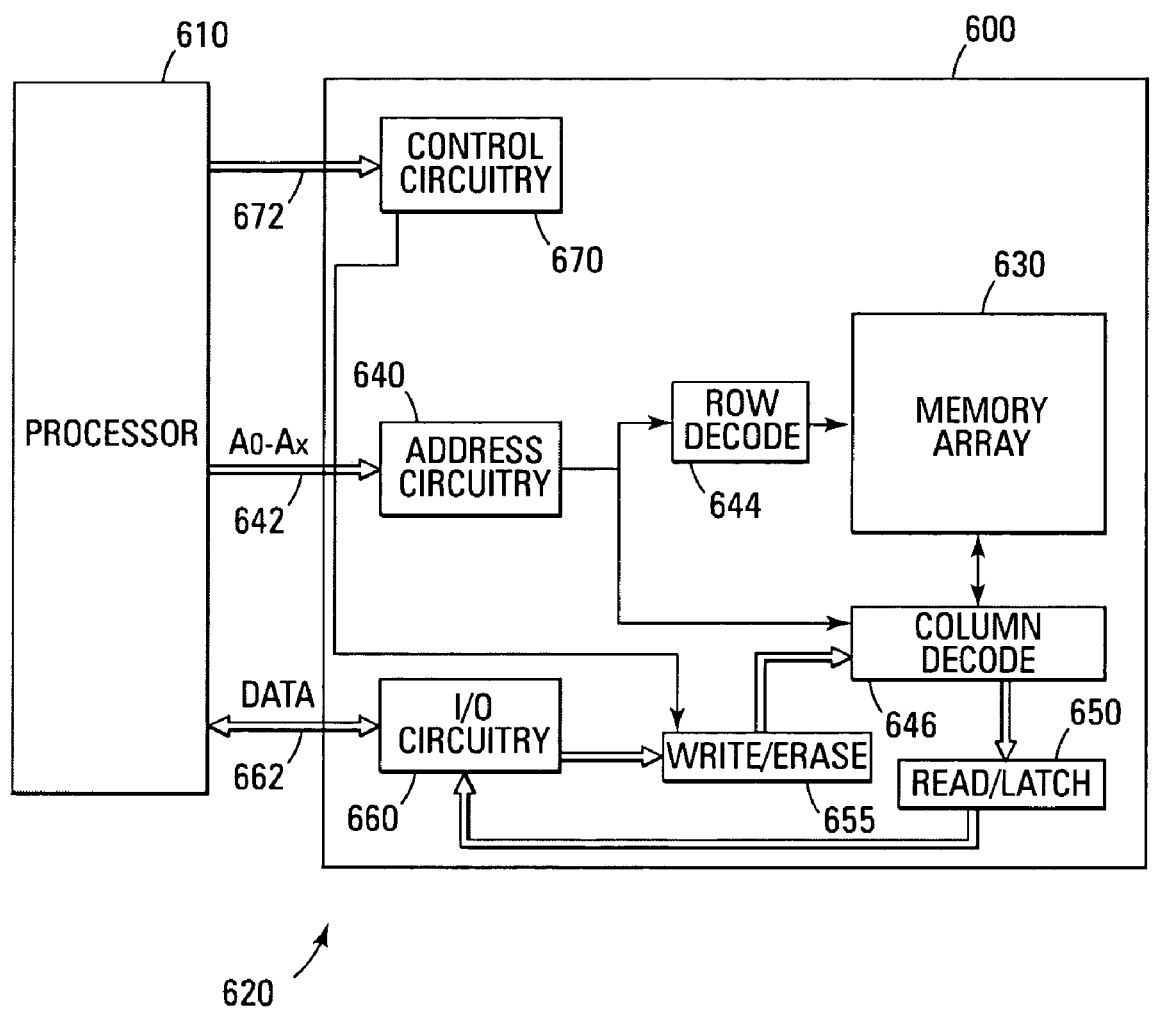
FIG. 6 shows a block diagram of one embodiment of an electronic system of the present invention.

FIG. 6 illustrates a functional block diagram of a memory device 600 of one embodiment of the present invention that is coupled to a processor 610. The processor 610 may be a microprocessor, a processor, or some other type of controlling circuitry. The memory device 600 and the processor 610 form part of an electronic system 620. The memory device 600 has been simplified to focus on features of the memory that are helpful in understanding the present invention.

The memory device includes an array of memory cells 630. In one embodiment, the memory cells are non-volatile floating-gate memory cells and the memory array 630 is arranged in banks of rows and columns.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The above-described embodiments have focused on a NAND architecture memory array. However, the present invention is not limited to this architecture. The embodiments of the memory block erase method of the present invention can be used in any architecture of memory device (e.g., NAND, NOR, AND).

The memory device 600 reads data in the memory array 630 by sensing voltage or current changes in the memory array columns using sense/latch circuitry 650. The sense/latch circuitry, in one embodiment, is coupled to read and latch a row of data from the memory array 630. Data input and output buffer circuitry 660 is included for bi-directional data communication over a plurality of data connections 662 with the controller 610). Write circuitry 655 is provided to write data to the memory array.

Control circuitry 670 decodes signals provided on control connections 672 from the processor 610. These signals are used to control the operations on the memory array 630, including data read, data write, and erase operations. In one embodiment, the control circuitry 670 controls operation of the embodiments of the sensing scheme of the present invention. The control circuitry 670 may be a state machine, a sequencer, or some other type of controller.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, the sense amplifier circuitry of the present invention provides low voltage operation with low power consumption. Additionally, the silicon area required on the IC die is reduced over the prior art sense amplifier. Reference cell programming time is significantly reduced while the access time for multi-bit read operations is increased. Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A sense amplifier circuit for sensing a programmed state of a plurality of memory cells, the circuit comprising:
   a ramp generator for generating a time varying signal;
   a plurality of sense amplifiers that are each coupled to a current signal from a different set of the plurality of memory cells, each of the plurality of sense amplifiers generating a digital output signal in response to the current signal;
   a plurality of latches, each latch coupled to a digital output signal of the plurality of sense amplifiers, the latches latching the digital output signal in response to a level of the time varying signal; and
   a plurality of reference memory cells that each generates a different input reference signal, wherein each reference signal is a memory cell reference current,
   wherein the time varying signal is a ramping current signal, and a latch signal from a first reference sense amplifier toggles when the ramping current signal exceeds the memory cell reference current that is input to the first reference sense amplifier.

2. The circuit of claim 1 wherein each set of the plurality of memory cells comprises a column of memory cells coupled to a bit line.

3. The circuit of claim 1 wherein the memory cells are flash memory cells that are each capable of storing a plurality of bits.

4. The circuit of claim 1 wherein the plurality of memory cells are arranged in a NAND configuration.

5. The circuit of claim 1 wherein the time varying signal is a ramping current generated in response to a ramped voltage.

6. A sense amplifier circuit for sensing programmed states of a plurality of multiple level memory cells arranged in rows and columns, each column coupled to a bit line, the circuit comprising:
   a plurality of reference memory cells that each generate a reference current;
   a ramp generator circuit for generating a ramped voltage;
   a plurality of reference sense amplifiers each coupled to the ramp generator circuit and a different reference memory cell of the plurality of reference memory cells, each reference sense amplifier comparing its respective reference current with a ramped current signal generated in response to the ramped voltage and toggling a latch signal in response to the ramped current signal being substantially equal to or greater than its respective reference current;

a plurality of sense amplifiers that are each coupled to different bit line, each of the plurality of sense amplifiers generating a digital output signal in response to a bit line current on each bit line; and a plurality of latches each coupled to a digital output signal of the plurality of sense amplifiers for latching the digital output signal in response to the toggling of the latch signal.

7. The circuit of claim 6 wherein the digital output signal toggles from a logical high to a logical low when the bit line current increases past a predetermined threshold current.

8. The circuit of claim 6 and further including a plurality of encoder circuits each coupled to a set of the plurality latches, each encoder circuit outputting a predetermined data signal in response to latch signals.

9. The circuit of claim 6 wherein each sense amplifier is coupled to a plurality of latches such that the latch signals latch an output of the sense amplifier at different times in response to the ramped current signal being substantially equal to or greater than one of the reference currents.

10. A sense amplifier circuit for sensing programmed states of a plurality of multiple level memory cells that are arranged in bit line columns, the circuit comprising:

a ramp generator circuit for generating a time varying voltage;

a plurality of reference sense amplifiers each coupled to the ramp generator circuit and a different input reference current, each reference sense amplifier comparing its respective input reference current with a time varying current signal generated from the time varying voltage and toggling a latch signal when the time varying current signal is greater than the input reference current;

a plurality of sense amplifiers that are each coupled to a different bit line current signal, each of the plurality of sense amplifiers generating a digital output signal in response to the current signal;

a plurality of sets of latches, each set coupled to a different digital output signal, the latches latching a state of the digital output signal in response to the toggling of the latch signal; and a plurality of encoder circuits, each encoder coupled to a different set of latches and generating predetermined output data signals in response to the states of the latches in each set, wherein the time varying current signal is a ramping current generated in response to the time varying voltage.

11. The circuit of claim 10 wherein the quantity of the plurality of reference sense amplifiers is substantially the same as the quantity of latches in each of the plurality of sets of latches.

12. A flash memory device comprising:

a flash memory array arranged in columns and rows, each column comprised of a series of multiple level memory cells coupled to a bit line, each bit line having a bit line current; and a sense amplifier circuit for sensing programmed states of the multiple level memory cells, the circuit comprising:

a reference current generation circuit for generating a plurality of reference currents;

a ramp generator circuit for generating a time varying voltage;

a plurality of reference sense amplifiers each coupled to the ramp generator circuit and a different reference current of the plurality of reference currents, each reference sense amplifier comparing its respective input reference current with a time varying current signal generated from the time varying voltage and toggling a latch signal when the time varying current signal is greater than the input reference current;

a plurality of sense amplifiers that are each coupled to a different bit line current, each of the plurality of sense amplifiers generating a digital output signal in response to a comparison of the bit line current being with a predetermined threshold; and a plurality of sets of latches, each set coupled to a different digital output signal, the latches storing a state of the digital output signal in response to the toggling of the latch signal.

13. The device of claim 12 wherein the time varying current signal increases with amplitude over a period of time.

14. The device of claim 12 wherein the reference current generation circuit is comprised of a plurality of reference flash memory cells that each generates a different reference current.

15. An electronic system comprising:

a processor that generates control signals for the system; and a flash memory device coupled to the processor and operating in response to the control signals, the device comprising:

a flash memory array having at least one column of multiple level memory cells coupled to a bit line having a bit line current; and a sense amplifier circuit for sensing states of the multiple level memory cells, the circuit comprising:

a ramp generator circuit for generating a time varying signal;

a plurality of reference sense amplifiers each coupled to the ramp generator circuit and a different reference current of a plurality of reference currents, each reference sense amplifier toggling a latch signal in response to a comparison of the time varying signal with its respective reference current;

a plurality of sense amplifiers that are each coupled to a different bit line current, each of the plurality of sense amplifiers generating a digital output signal in response to a comparison of the bit line current with a predetermined threshold; and a plurality of sets of latches, each set coupled to a different digital output signal, the latches storing a state of the digital output signal in response to the toggling of the latch signal.

16. A sense amplifier circuit for sensing programmed states of a plurality of multiple level flash memory cells arranged in rows and columns, each column of memory cells coupled to a bit line having a bit line current, the circuit comprising:

a reference current generation circuit comprised of a first reference flash memory cell that generates a first reference current, a second reference flash memory cell that generates a second reference current, and a third reference flash memory cell that generates a third reference current;

a voltage ramp generator circuit for generating a ramped voltage;

first, second, and third reference sense amplifiers each respectively coupled to the first, second, and third reference flash memory cells, each reference sense amplifier comparing its respective input reference current with a ramped current generated from the ramped voltage and each reference sense amplifier generating a respective first, second, and third latch signal in response to the comparison;

a plurality of sense amplifiers that are each coupled to different bit line, each of the plurality of sense amplifiers adapted to generate a digital output signal in response to its respective bit line current; and a plurality of latch sets, each latch set coupled to a different sense amplifier of the plurality of sense amplifiers, each latch in the latch set coupled to one of the first, second, or third latch signals and latching the digital output signal of its respective sense amplifier in response to the coupled latch signal.

17. A multiple level, non-volatile memory device comprising:

a memory array arranged in columns and rows, each column comprised of a series of multiple level memory cells coupled to a bit line, each bit line having a bit line current, and read circuitry for determining states of the multiple level memory cells, the read circuitry comprising:

a ramp generator circuit for generating a time varying voltage;

a plurality of sense amplifiers that are each coupled to a different bit line current, each of the plurality of sense amplifiers generating a digital output signal in response to a comparison of the bit line current with a predetermined threshold;

a plurality of sets of latches, each set coupled to a different digital output signal, the latches storing a state of the digital output signal in response to the time varying voltage; and a plurality of reference memory cells that each generates a different input reference signal, wherein each reference signal is a memory cell reference current, wherein the time varying voltage generates a ramping current signal, and a latch signal from a first reference sense amplifier toggles when the ramping current signal exceeds the memory cell reference current that is input to the first reference sense amplifier.

18. A sense amplifier circuit for sensing a programmed state of a plurality of memory cells, the circuit comprising:

a ramp generator circuit for generating a time varying signal;

a plurality of reference sense amplifiers, each coupled to the ramp generator circuit and a different input reference signal, each reference sense amplifier comparing the input reference signal with the time varying signal and toggling a latch signal in response to the comparison;

a plurality of sense amplifiers that are each coupled to a current signal from a different set of the plurality of memory cells, each of the plurality of sense amplifiers generating a digital output signal in response to the current signal; and a plurality of latches, each latch coupled to a digital output signal of the plurality of sense amplifiers, the latches latching the digital output signal in response to the toggling of the latch signal.

* * * * *

UNITED STATES PATENT AND TRADEMARK OFFICE
CERTIFICATE OF CORRECTION

PATENT NO. : 7,324,381 B2  Page 1 of 1
APPLICATION NO. : 11/416672
DATED : January 29, 2008
INVENTOR(S) : Gallo et al.

It is certified that error appears in the above-identified patent and that said Letters Patent is hereby corrected as shown below:

On the title page, item (75), in "Inventor", in column 1, line 1, delete "Padua" and insert -- Padova --, therefor.

Column 12, line 14, in Claim 12, after "signal" delete "." and insert -- wherein the varying current signal is a ramping current generated in response to the time varying voltage. --, therefor.

Column 12, line 49, in Claim 15, after "signal" delete "." and insert -- wherein the varying signal is a ramping current generated in response to a ramped voltage. --, therefor.

Column 14, line 30, in Claim 18, after "signal" delete "." and insert -- wherein the time varying signal is a ramping current generated in response to a ramped voltage. --, therefor.

Signed and Sealed this

Sixth Day of May, 2008

JON W. DUDAS
*Director of the United States Patent and Trademark Office*